United States Patent
Lee

(10) Patent No.: US 10,606,485 B2
(45) Date of Patent: *Mar. 31, 2020

(54) NONVOLATILE MEMORY DEVICE, DATA STORAGE DEVICE AND OPERATING METHOD THEREOF

(71) Applicant: SK hynix Inc., Gyeonggi-do (KR)

(72) Inventor: Sok Kyu Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/428,225

(22) Filed: May 31, 2019

(65) Prior Publication Data

US 2019/0286336 A1  Sep. 19, 2019

Related U.S. Application Data

(63) Continuation of application No. 15/337,741, filed on Oct. 28, 2016, now Pat. No. 10,310,741.

(30) Foreign Application Priority Data

Jul. 18, 2016 (KR) .................... 10-2016-0090940

(51) Int. Cl.
*G11C 16/30* (2006.01)
*G06F 3/06* (2006.01)
*G06F 12/02* (2006.01)
*G11C 19/00* (2006.01)
*G11C 16/22* (2006.01)
*G11C 16/34* (2006.01)

(52) U.S. Cl.
CPC .......... *G06F 3/0611* (2013.01); *G06F 3/0655* (2013.01); *G06F 3/0679* (2013.01); *G06F 12/0246* (2013.01); *G11C 16/225* (2013.01); *G11C 16/3459* (2013.01); *G11C 19/00* (2013.01); *G06F 2212/7202* (2013.01); *G06F 2212/7203* (2013.01); *G06F 2212/7206* (2013.01); *G06F 2212/7207* (2013.01)

(58) Field of Classification Search
None
See application file for complete search history.

(56) References Cited

U.S. PATENT DOCUMENTS

2005/0251704 A1* 11/2005 Wagner ............... G06F 1/24
   714/47.2
2011/0026318 A1* 2/2011 Franceschini ....... G06F 13/161
   365/163

* cited by examiner

*Primary Examiner* — Douglas King
(74) *Attorney, Agent, or Firm* — IP & T Group LLP

(57) ABSTRACT

A nonvolatile memory device includes a target memory area; a control unit configured to apply a program pulse one or more times to the target memory area in response to a program command, until program verification passes; and a status storage unit configured to store a program status information for the target memory area, wherein the control unit is supplied with a first operation voltage, and the status storage unit is supplied with a second operation voltage.

16 Claims, 5 Drawing Sheets

NONVOLATILE MEMORY DEVICE, DATA STORAGE DEVICE AND OPERATING METHOD THEREOF

CROSS-REFERENCES TO RELATED APPLICATION

This application is a continuation of U.S. patent application Ser. No. 15/337,741 filed on Oct. 28, 2016 which claims benefits of priority of Korean Patent Application No, 10-2016-0090940 filed on Jul. 18, 2016. The disclosure of each of the foregoing application is incorporated herein by reference in its entirety.

BACKGROUND

1. Technical Field

Various embodiments of the present invention relate generally to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external device or may be fabricated separately and then connected afterwards to an external device.

SUMMARY

An embodiment of the present invention is directed to a nonvolatile memory device including: a target memory area; a control unit configured to apply a program pulse one or more times to the target memory area in response to a program command, until program verification passes; and a status storage unit configured to store a program status information for the target memory area, wherein the control unit is supplied with a first operation voltage, and the status storage unit is supplied with a second operation voltage.

Another embodiment of the present invention is directed to a data storage device including: a nonvolatile memory device including a target memory area, a control unit configured to perform a program operation for the target memory area, and be supplied with a first operation voltage, and a status storage unit configured to store a program status information for the target memory area, while the program operation is performed, and be supplied with a second operation voltage; and a controller configured to control the nonvolatile memory device.

Another embodiment of the present invention is directed to a method for operating a data storage device, the method including: obtaining a status information from a nonvolatile memory device, when it is determined that a program operation for a target memory area of the nonvolatile memory device is interrupted; and determining, based on the status information, whether to resume the program operation for the target memory area.

Yet another embodiment of the present invention is directed to a data processing system including a data storage device coupled to a host, the data storage device including a nonvolatile memory device including: a control unit suitable for applying a program pulse to a target memory area of the nonvolatile memory device in response to a program command one or more times until a program verification passes; and a status storage unit suitable for storing a program status information of the target memory area; wherein the control unit is operable by a first operation voltage supplied by a first voltage supply unit, the status storage unit is operable by a second operation voltage supplied by a second voltage supply unit, the first and second voltage supply units being operable independently from one another. The first and second voltage supply units are included in the host.

BRIEF DESCRIPTION OF THE DRAWINGS

These and other features and advantages of the present invention will become more apparent to those skilled in the art to which the present invention pertains in view of the following detailed description of various embodiments of the present invention in reference to the following drawings wherein.

DETAILED DESCRIPTION

Figure 1:
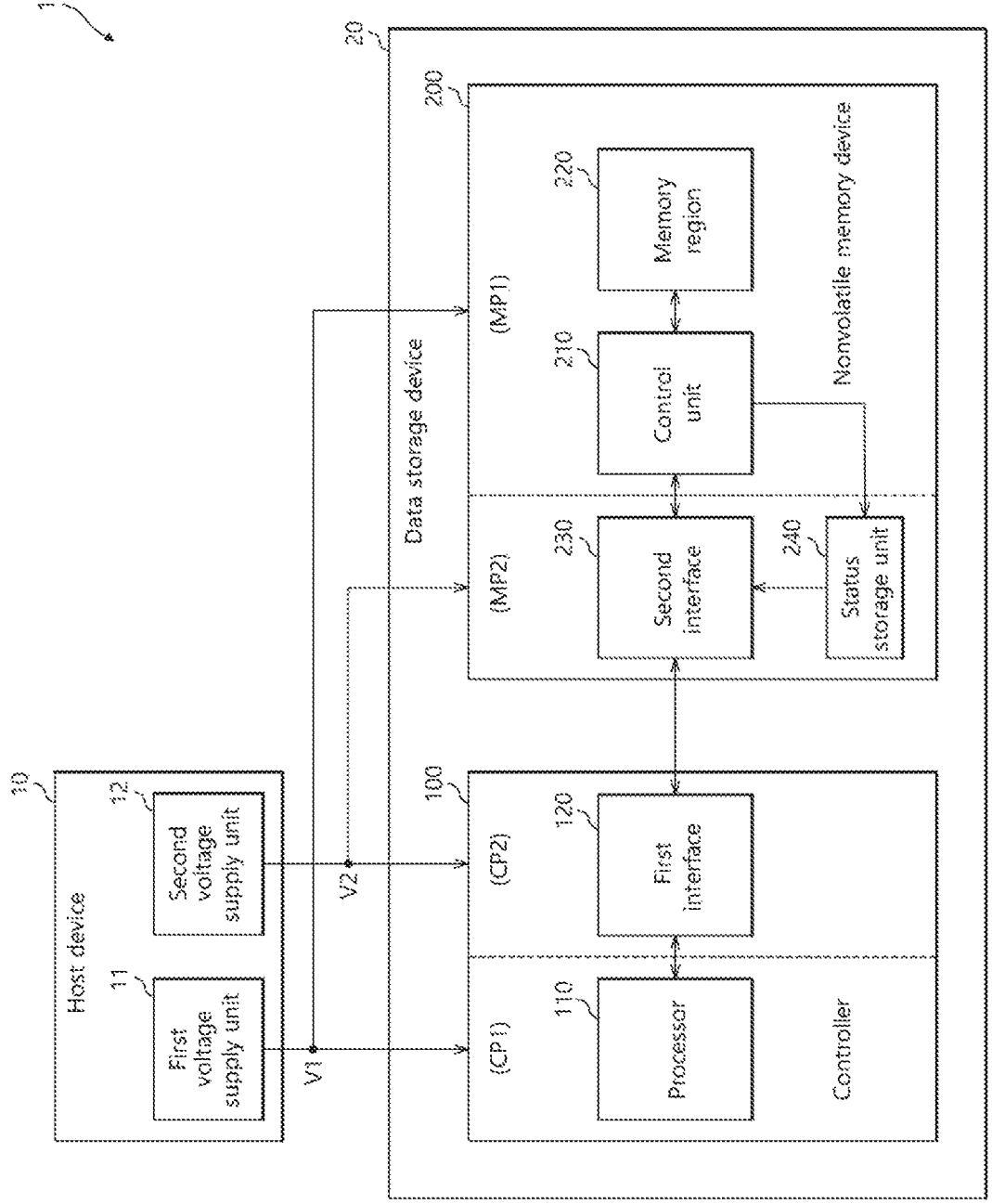
FIG. 1 is a block diagram illustrating a data processing system including a data storage device coupled to a host device, in accordance with an embodiment of the present invention.

Hereinafter, various embodiments of the present invention, including a semiconductor memory device, a data storage device including the same and an operating method thereof, will be described with reference to the accompanying drawings. The present invention may, however, be embodied in different other forms and should not be construed as being limited to the embodiments set forth herein. Rather, these embodiments are provided to describe the present invention in sufficient detail so that a person skilled in the art to which the invention pertains can practice the invention.

It is to be understood that embodiments of the present invention are not limited to the particulars shown in the drawings, that the drawings are not necessarily drawn to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be also understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Referring now to FIG. 1, a data processing system 1 is provided, in accordance with an embodiment of the present invention.

The data processing system 1 may be an electronic system which processes data. The data processing system 1 may be a portable electronic system. The data processing system 1 may be a non-portable electronic system. The data processing system 1 may be a mobile electronic system. The data processing system 1 may be, for example, a desktop computer, a laptop, a netbook, a tablet, a smart phone, a smart card, a digital TV, a digital camera, a navigator, and the like.

The data processing system 1 includes a data storage device 20 coupled to a host device 10.

The host device 10 may control the data storage device 20 for storing data in the data storage device 20.

The host device 10 may include first and second voltage supply units 11 and 12. The first voltage supply unit 11 may supply a first voltage V1 to the data storage device 20. The second voltage supply unit 12 may supply a second voltage V2 to the data storage device 20. The first and second voltages V1 and V2 may be the same or different. The first and second voltage supply units 11 and 12 may operate independently from each other. Therefore, for example, when the voltage supply of the first voltage supply unit 11 is interrupted for whatever reason, the second voltage supply unit 12 may continue to operate to supply the second voltage V2 to the data storage device. Likewise, when the voltage supply of the second voltage supply unit 12 is interrupted for whatever reason, the first voltage supply unit 11 may continue to operate to supply the first voltage V1 to the data storage device.

It is noted that although in the illustrated embodiment of FIG. 1, the first and second voltage supply units 11 and 12 are included in the host device 10, the present invention may not be limited in this way. For example, in another embodiment (not shown), the first and second voltage supply units 11 and 12 may be included in the body of the data storage unit 20.

The data storage device 20 may store data according to control of the host device 10. The data storage device 20 may be, for example, a personal computer memory card international association (PCMCIA) card, a compact flash (CF) card, a smart media card, a memory stick, various multimedia cards (MMC, eMMC, RS-MMC, and MMC-Micro), various secure digital cards (SD, Mini-SD, and Micro-SD), a universal flash storage (UFS), a solid state drive (SSD) and the like.

According to the illustrated embodiment of FIG. 1, the data storage device 20 includes a controller 100 and a memory device 200. The memory device 200 may be or include a nonvolatile memory device. As illustrated in the embodiment of FIG. 1, the memory device 200 may be a nonvolatile memory device.

While it is illustrated in FIG. 1 that the data storage device 20 includes one nonvolatile memory device 200, it is to be noted that the invention is not limited thereto. For example, the data storage device 20 may include a plurality of memory devices 200. The plurality of memory devices may be the same type or different type.

The controller 100 may control at least one operation of the nonvolatile memory device 200 including at least one of a read, write, erase and background operations. For example, the controller may store data in the nonvolatile memory device 200 in response to a write request transmitted from the host device 10. Also, the controller 100 may read data stored in the nonvolatile memory device 200 and output the read data to the host device 10 in response to a read request transmitted from the host device 10.

The controller 100 may include a processor 110 and a first interface 120.

The processor 110 may control the nonvolatile memory device 200. The processor 110 may obtain a program status information of the nonvolatile memory device 200 when it is determined that a program operation to a target memory area of the nonvolatile memory device 200 is interrupted. The program status information may be stored in a status storage unit 240 of the nonvolatile memory device 200. The processor 110 may determine, based on the program status information, whether to resume the program operation to the target memory area or to perform a program operation to another memory area of a memory region 220 other than the target memory area. The processor 110 may be positioned in a first power region CP1 which is supplied with the first voltage V1 from the host device 10.

The first interface 120 may communicate with a second interface 230 of the nonvolatile memory device 200 according to control of the processor 110. The first interface 120 may be positioned in a second power region CP2 which is supplied with the second voltage V2 from the host device 10.

The nonvolatile memory device 200 may store data transmitted from the controller 100 and may read stored data and transmit read data to the controller 100, according to control of the controller 100. The nonvolatile memory device 200 may retain data stored in the memory region 220 even when the power supply to the device is turned off or interrupted. The nonvolatile memory device 200 may be, for example, a flash memory, such as a NAND flash or a NOR flash, a ferroelectrics random access memory (FeRAM), a phase-change random access memory (PCRAM), a magneto-resistive random access memory (MRAM), a resistive random access memory (ReRAM), and the like.

The nonvolatile memory device 200 may include a control unit 210, the memory region 220, the second interface 230, and the status storage unit 240.

The control unit 210 may control the nonvolatile memory device 200. The control unit 210 may perform a program operation to store data in a target memory area of the memory region 220 in response to a program command received from the controller 100. The program command may be transmitted from the processor 110 of the controller 100 through the first and second interfaces 120 and 230 to the control unit 210. Upon receipt of the program command from the controller 100, the control unit 210 may then perform the program operation corresponding to the received program command. For example, the control unit 210 may perform the program operation by iterating the steps of a program loop which includes applying a program pulse to the target memory area and performing program verification until the program verification passes or until a number of program loops reaches a maximum number. The control unit 210 may raise the level of the program pulse each time the program loop is repeated.

Also, the control unit 210 may store the program status information for the target memory area in the status storage unit 240 while the program operation is performed. The program status information may include a pulse count. The control unit 210 may increase the pulse count stored in the status storage unit 240 each time that the program pulse is applied to the target memory area during the program operation. The control unit 210 may be positioned in a first power region MP1 which is supplied with the first voltage V1 from the host device 10.

The memory region 220 may store the data, for which the program operation is performed, according to control of the control unit 210. The memory region 220 may include a plurality of nonvolatile memory cells. The memory region 220 may be positioned in the first power region MP1 which is supplied with the first voltage V1 from the host device 10.

The second interface 230 may serve as a communication link between the controller 100, e.g., with the first interface 120 of the controller 100 and the control unit 210, under the control of the control unit 210. The second interface 230 may be positioned in a second power region MP2 which is supplied with the second voltage V2 from the host device 10.

The status storage unit 240 may store the program status information, that is, the pulse count. The program status information stored in the status storage unit 240 may be transmitted to the controller 100 through the second interface 230 in response to a status transmission command of the controller 100. The status storage unit 240 may be positioned in the second power region MP2 which is supplied with the second voltage V2 from the host device 10.

Figure 2:
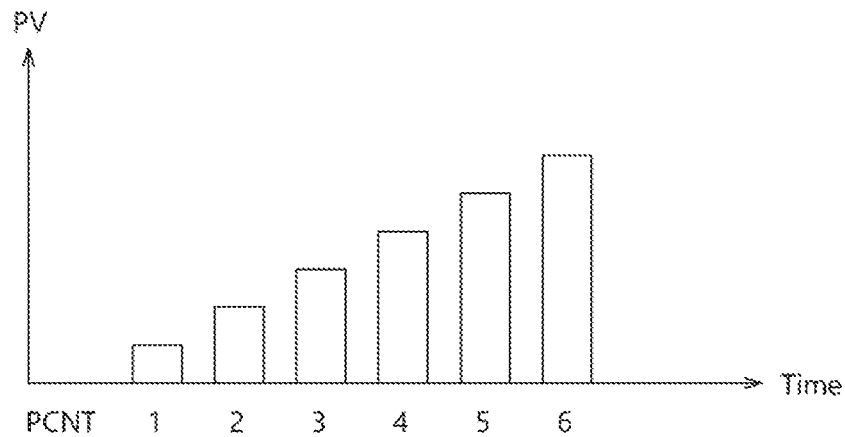
FIG. 2 is a diagram illustrating a program pulse applied to a target memory area when a control unit of the data storage device of FIG. 1 performs a program operation.

FIG. 2 illustrates a program pulse PV applied to the target memory area when the control unit 210 of FIG. 1 performs the program operation.

As stated earlier, when performing the program operation, the control unit 210 may apply the program pulse PV to the target memory area one or more times until program verification passes, i.e., is successful or until a number of program loops reaches a maximum number. Referring to FIG. 2, an example is illustrated wherein when performing a program operation, the control unit 210 applied the program pulse PV to the target memory area six times until the program verification was successful. More in detail, the control unit 210 applied a first program pulse PV at a first time 1, and then performed a first program verification for the target memory area. Because the first program verification did not pass, the control unit applied a second program pulse to the target memory area at a second time 2. The second program pulse PV had an increased level than the first program pulse PV applied at time 1. Following application of the second program pulse PV at time 2, the control unit performed a second program verification operation. Because the second program verification operation also did not pass, the process was repeated four more times until after application of a sixth program pulse the sixth program verification operation passed. Hence, in iterating the program loop each time a program verification for a program pulse fails, the control unit 210 applies a program pulse PV having a higher level than the level of the immediately previous program pulse applied to the target memory area.

The control unit 210 increases a pulse count PCNT stored in the status storage unit 240 each time of applying the program pulse PV. Therefore, a pulse count PCNT represents how many times a program pulse has been iteratively applied during a program operation to a target memory area.

Referring again to FIG. 1, even though a program operation may be interrupted due to, for example, a sudden power-off, the pulse count PCNT stored in the status storage unit 240 is retained. This is because the status storage unit 240 is positioned in the second power region MP2 which is powered independently from the first power region MP1 where the program operation is performed. Thus, when it is determined that the program operation is interrupted by a sudden power-off, the processor 110 may identify the status of the program operation at the interruption through the pulse count PCNT stored in the status storage unit 240, and may determine whether to resume the program operation to the target memory area according to the status program information.

In more detail, a pulse count PCNT smaller than a threshold value may represent that the program operation has not been performed to the target memory area. The threshold value may be smaller than a maximum number of program loops. Therefore, when the pulse count PCNT is smaller than a threshold value, the processor 110 may determine to resume the program operation for the target memory area.

The pulse count PCNT equal to or larger than the threshold value may represent that the program operation has been performed to the target memory area, however, reliability of data may not be ensured because of the sudden power-off. Therefore, when the pulse count PCNT is equal to or larger than the threshold, the processor 110 may determine to perform a program operation to another memory area other than the target memory area in the memory region 220.

Figure 3:
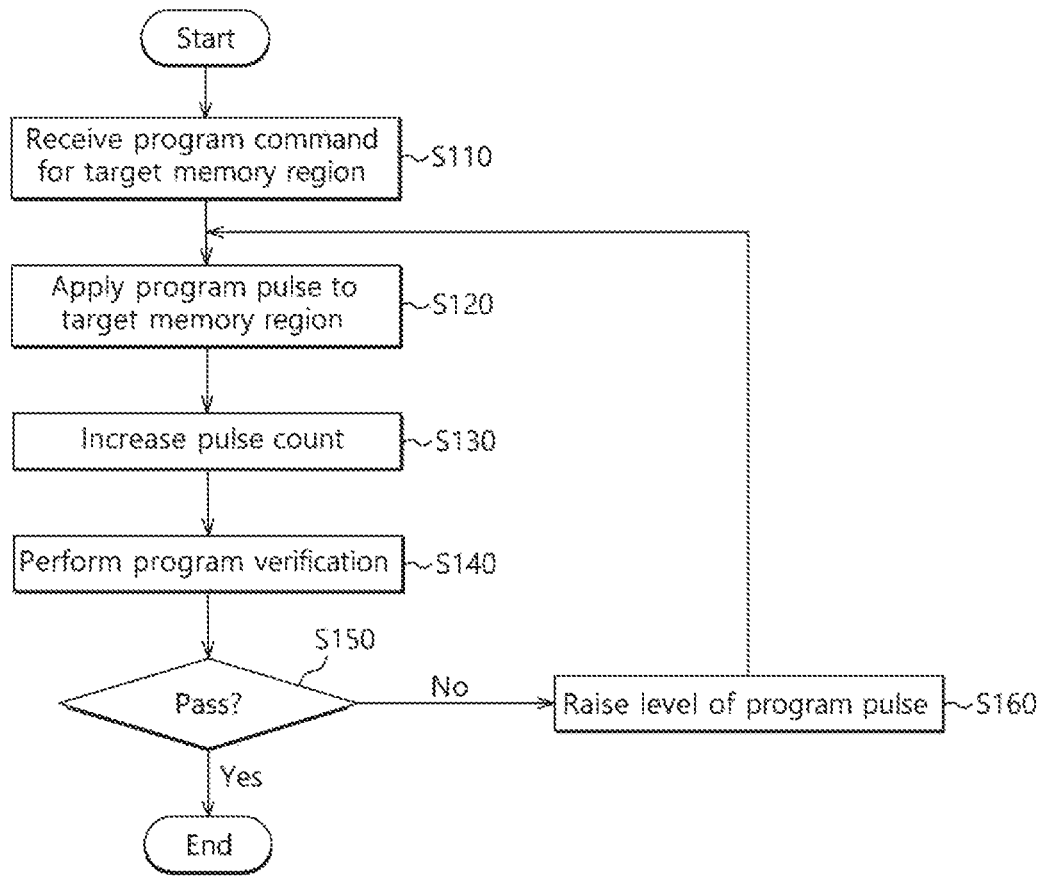
FIG. 3 is a flow chart illustrating a program operation method of the nonvolatile memory device of FIG. 1.

FIG. 3 is a flow chart illustrating a program operation method of the nonvolatile memory device 200 of FIG. 1.

At step S110, the nonvolatile memory device 200 may receive a program command for a target memory area, from the controller 100.

At step S120, the control unit 210 may apply a program pulse to the target memory area.

At step S130, the control unit 210 may increase a pulse count PCNT stored in the status storage unit 240 to reflect the application of the program pulse at step S120 into the pulse count PCNT.

At step S140, the control unit 210 may perform a program verification for the target memory area.

At step S150, the control unit 210 may determine whether or not the program verification passes, i.e., is successful. When the program verification is successful, the process may be ended. When the program verification is not successful (i.e., failed) the process may proceed to step S160.

At step S160, the control unit 210 may raise the level of the program pulse. Then, the process may proceed back to the step S120. That is to say, the control unit 210 may perform a program operation by iterating a program loop of applying a program pulse and performing program verification to the target memory area until the program verification to the target memory area passes.

Figure 4:
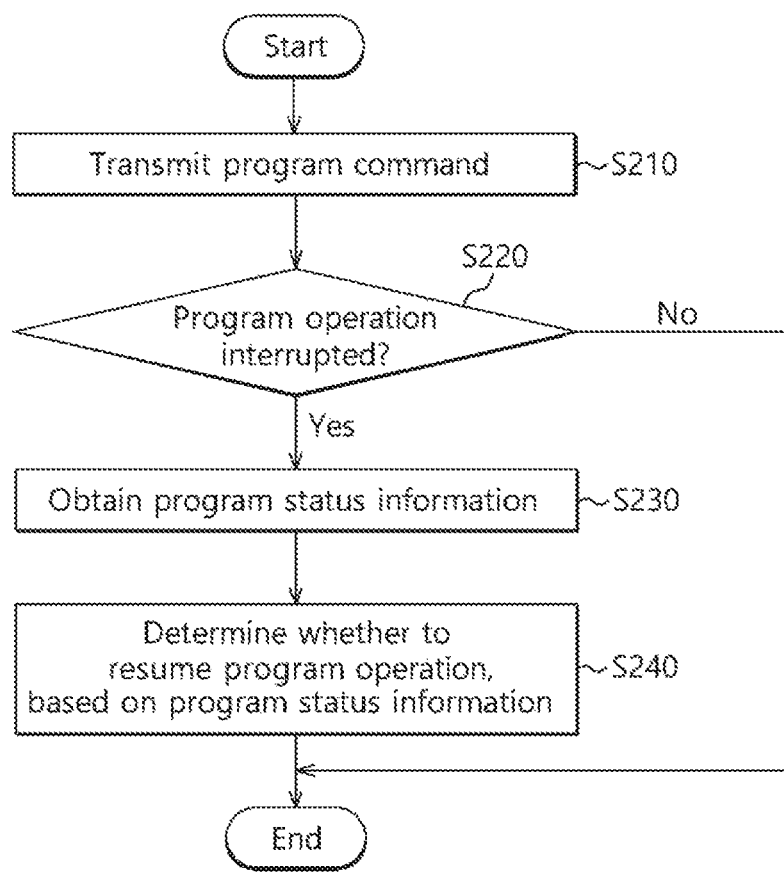
FIG. 4 is a flow chart illustrating an operation method of the controller of FIG. 1.

FIG. 4 is a flow chart illustrating an operation method of the controller 100 of FIG. 1.

At step S210, the controller 100 may transmit a program command for a target memory area to the nonvolatile memory device 200.

At step S220, the controller 100 may determine whether or not a program operation is interrupted. For example, the controller 100 may determine whether or not the program operation is interrupted when power is supplied again after a sudden power-off. When it is determined that the program operation was interrupted, the process may proceed to step S230. When it is determined that the program operation was not interrupted, the process may be ended.

At step S230, the controller 100 may obtain the program status information, that is, the pulse count PCNT stored in the status storage unit 240 of the nonvolatile memory device 200. The pulse count PCNT may represent a program status for the target memory area, that is, the number of program pulses applied to the target memory area before the program operation is interrupted. Since the status storage unit 240 is positioned in the second power region MP2, the status storage unit 240 may retain the pulse count PCNT stored therein even when a sudden power-off occurs in the first power region MP1.

At step S240, the controller 100 may determine whether to resume the program operation to the target memory area, based on the program status information, that is, the pulse count PCNT. For example, when the pulse count PCNT is smaller than a threshold value, the controller 100 may determine to resume the program operation for the target memory area. When the pulse count PCNT is equal to or larger than the threshold, the controller 100 may determine to perform a program operation to another memory area other than the target memory area in the memory region 220.

Figure 5:
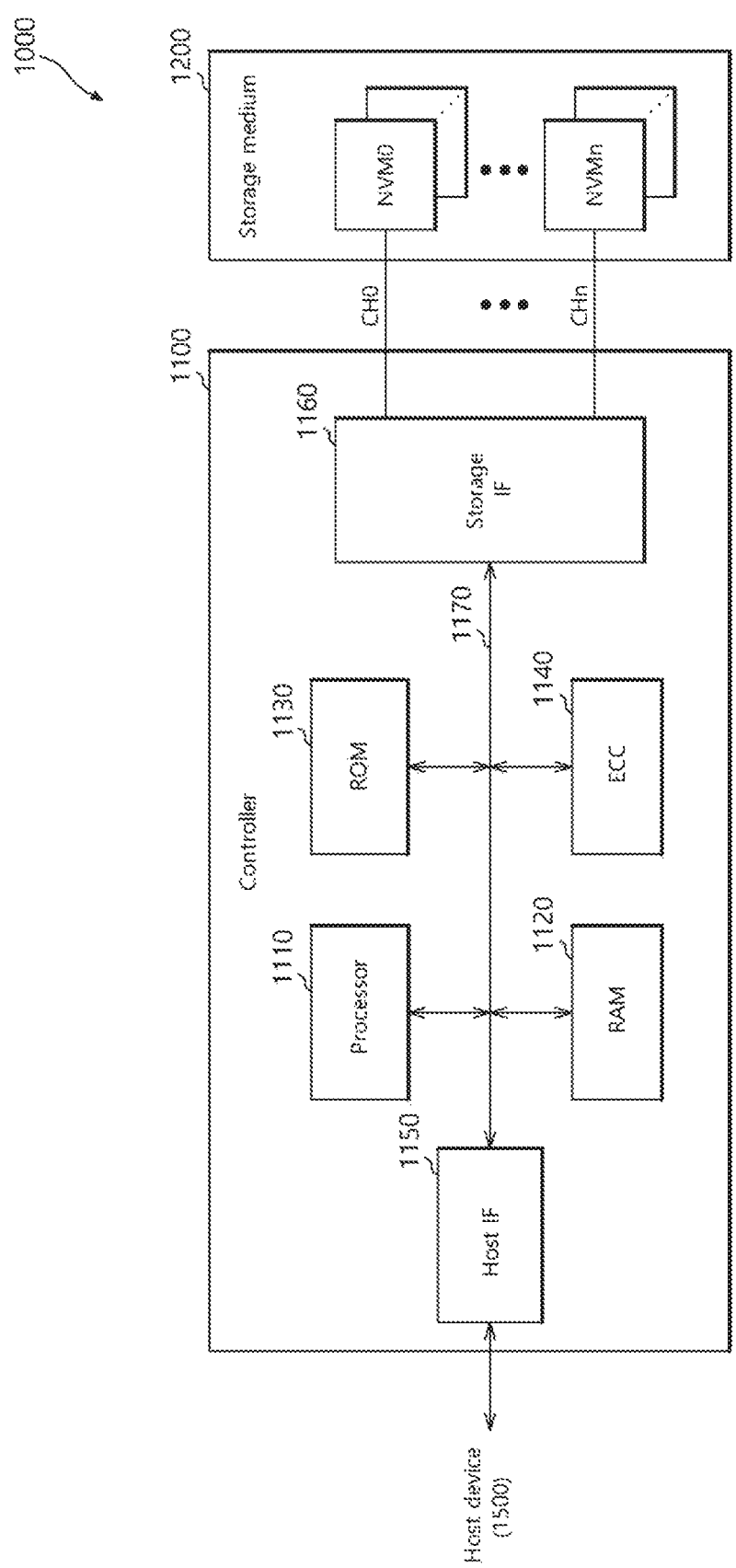
FIG. 5 is a block diagram illustrating a solid state drive (SSD), in accordance with an embodiment of the present invention.

FIG. 5 is a block diagram illustrating a solid state drive (SSD) 1000, in accordance with an embodiment of the present invention.

The SSD 1000 may include a controller 1100 and a storage medium 1200. The SSD 1000 may operate substantially similarly to the data storage device 20 of FIG. 1.

The controller 1100 may control data exchange between a host device 1500 and the storage medium 1200. The controller 1100 may include a processor 1110, a RAM 1120, a ROM 1130, an ECC unit 1140, a host interface 1150 and a storage medium interface 1160 which are coupled through an internal bus 1170.

The processor 1110 may control at least one operation of the controller 1100. The processor 1110 may process data to and or from the storage medium 1200 in response to a data processing request received from the host device 1500. For example, the processor may store data in the storage medium 1200 and may read stored data from the storage medium 1200, according to data processing requests from the host device 1500. In order to efficiently manage the storage medium 1200, the processor 1110 may control internal operations of the SSD 1000 such as a merge operation a wear leveling operation, and so forth.

The processor 1110 may operate substantially similarly to the processor 110 of FIG. 1. The processor 1110 may obtain a program status information stored in a status storage unit of a nonvolatile memory device when it is determined that a program operation for a target memory area of the nonvolatile memory device is interrupted. The processor 1110 may determine, based on the program status information, whether to resume the program operation for the target memory area or to perform a program operation to another memory area other than the target memory area in the nonvolatile memory device.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn. The storage medium interface 1160 may operate substantially similarly to the first interface 120 of FIG. 1.

The storage medium 1200 may include a plurality of nonvolatile memory devices NVM0 to NVMn. Each of the plurality of nonvolatile memory devices NVM0 to NVMn may perform a write operation and a read operation according to control of the controller 1100. Each of the plurality of nonvolatile memory devices NVM0 to NVMn may be the same or substantially the same and operate the same or substantially the same to the nonvolatile memory device 200 of FIG. 1. Each of the plurality of nonvolatile memory devices NVM0 to NVMn may be supplied with a first voltage to be used in performing an internal operation and a second voltage to be used in communicating with the controller 1100, from the host device 1500. Each of the plurality of nonvolatile memory devices NVM0 to NVMn may store the count of program pulses applied to a target memory area while a program operation is performed, in a power region which is supplied with the second voltage.

Figure 6:
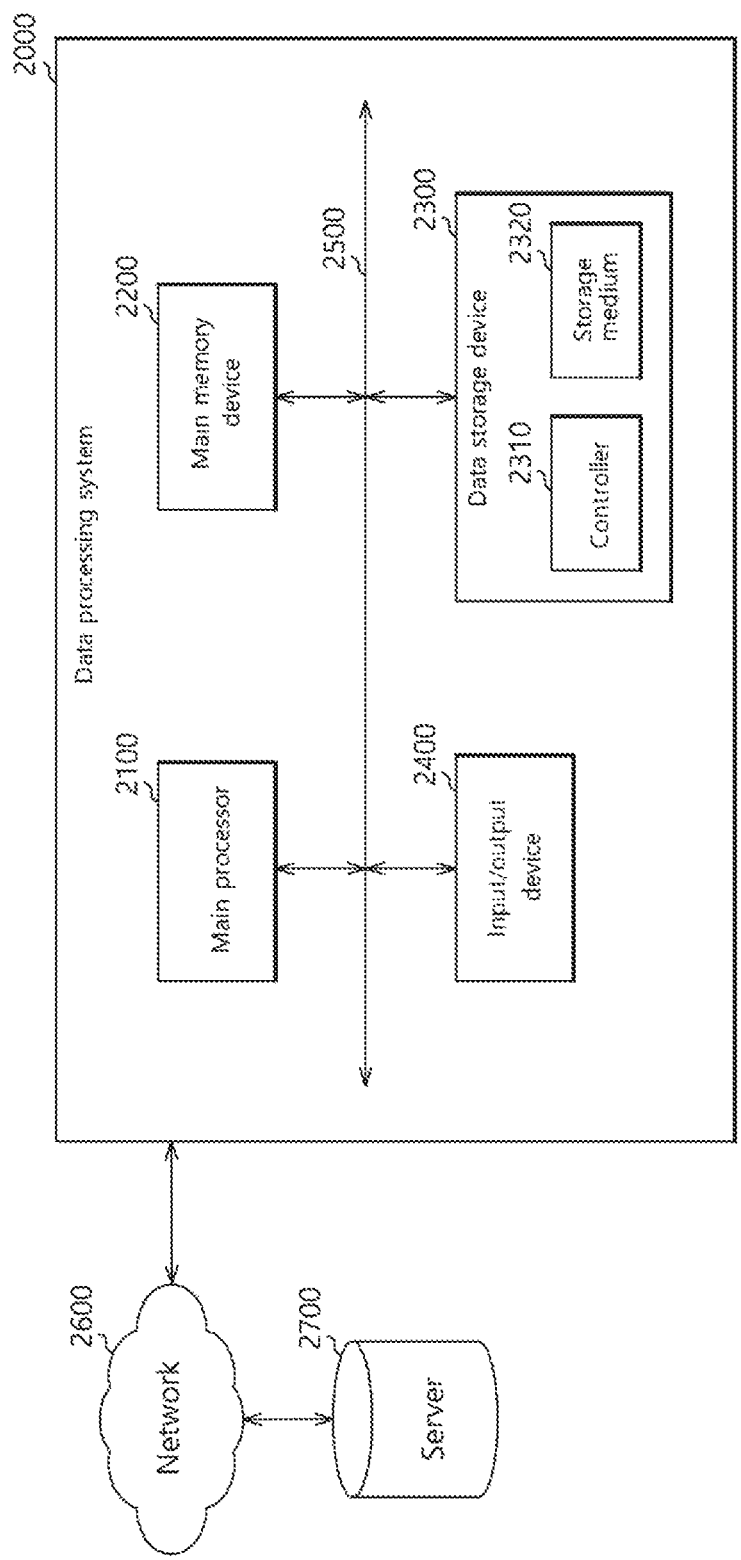
FIG. 6 is a block diagram illustrating a data processing system employing a data storage device, in accordance with an embodiment of the present invention.

FIG. 6 is a block diagram illustrating a data processing system 2000 including a data storage device 2300 in accordance with an embodiment of the present invention.

The data processing system 2000 may be non-portable, a portable or a mobile electronic device. For example, the data processing system may be or include a computer, a laptop, a netbook, a smart phone, a digital TV, a digital camera, a navigator, and the like. The data processing system 2000 may include a main processor 2100, a main memory device 2200, the data storage device 2300, and an input/output device 2400. The internal units of the data processing system 2000 may exchange data, control signals, etc. through a system bus 2500. The data processing system 2000 may be configured and operate the same or substantially the same as the data processing system 1 of FIG. 1.

The main processor 2100 may control at least one operation of the data processing system 2000. In an embodiment the main processor 2100 may control all the operations of the data processing system 2000. The main processor 2100 may be a central processing unit such as, for example, a microprocessor. The main processor 2100 may execute a software, such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate the same or substantially the same as the data storage device 20 of FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on. The data processing system 2000 may include a network interface (not shown) to access the network 2600.

While the invention has been described in reference to specific embodiments, it will be understood to those skilled in the art to which the invention pertains that the described embodiments are provided as examples of the invention only and are not intended to limit the scope of the invention. Accordingly, the nonvolatile memory device, the data storage device and the operating method thereof described herein should not be limited based on the described embodiments, and many other variations thereof may be envisaged by those skilled in the art to which the present invention pertains without departing from the spirit and scope of the present invention as defined by the following claims.

What is claimed is:

1. A data processing system comprising:
a data storage device; and
a host device external to the data storage device including first and second voltage supply units configured to supply first and second operation voltages to the data storage device,
wherein the data storage device includes:
a control unit configured to control program verification to pass by applying a program pulse to a target memory area of a nonvolatile memory device; and
a status storage unit configured to store program status information of the target memory area,
wherein the control unit is configured to be operated by a first operation voltage supplied from a first voltage supply unit of the host device, and the status storage unit is configured to be operated by a second operation voltage simultaneously supplied from a second voltage supply unit of the host device, and
wherein the first voltage supply unit is only coupled to the control unit and the target memory area of a first power region of the nonvolatile memory device and the second voltage supply unit is only coupled to the status storage unit of a second power region of the nonvolatile memory device.

2. The data processing system according to claim 1, wherein the first voltage supply unit is configured to operate independently from the second voltage supply unit.

3. The data processing system according to claim 1, wherein the control unit and the target memory area are positioned in the first power region and are configured to be supplied with the first operation voltage.

4. The data processing system according to claim 1, wherein the status storage unit is positioned in the second power region, which is separated from the first power region, and configured to be supplied with the second operation voltage separated from the first operation voltage.

5. The data processing system according to claim 1, wherein the program status information includes a pulse count, and
the control unit is configured to increase the pulse count each time that the program pulse is applied to the target memory area during a program operation.

6. The data processing system according to claim 5, wherein the data storage device further includes a controller configured to control the nonvolatile memory device.

7. The data processing system according to claim 6, wherein the controller includes a processor configured to determine whether to resume the program operation to the target memory area based on the pulse count when it is determined that the program operation is interrupted.

8. The data processing system according to claim 7, wherein the processor is configured to determine to resume the program operation to the target memory area when the pulse count is smaller than a threshold value.

9. The data processing system according to claim 7, wherein the processor is configured to determine to perform the program operation to another memory area other than the target memory area when the pulse count is equal to or larger than the threshold value.

10. The data processing system according to claim 6, wherein the nonvolatile memory device further includes a first interface configured to perform interfacing with the controller and configured to be supplied with the second operation voltage from the host device.

11. The data processing system according to claim 10, wherein the first interface is positioned in the second power region and configured to be supplied with the second operation voltage from the host device.

12. The data processing system according to claim 6, wherein the controller includes a second interface configured to perform interfacing with the nonvolatile memory device and configured to be supplied with the second operation voltage from the host device.

13. The data processing system according to claim 12, wherein the second interface is positioned in the second power region and configured to be supplied from the second operation voltage from the host device.

14. The data processing system according to claim 6, wherein the control unit is configured to transmit the program status information stored in the status storage unit to the controller in response to a status transmission command of the controller.

15. The data processing system according to claim 1, wherein the control unit is configured to iterate a program loop of applying a program pulse and performing the program verification until the program verification passes.

16. The data processing system according to claim 15, wherein the control unit is configured to raise the level of the program pulse each time the program loop is repeated.

* * * * *